United States Patent [19]
McClure

[11] Patent Number: 5,457,647
[45] Date of Patent: Oct. 10, 1995

[54] PASSIVE HIERARCHICAL BITLINE MEMORY ARCHITECTURE WHICH RESIDES IN METAL LAYERS OF A SRAM ARRAY

[75] Inventor: David C. McClure, Carrollton, Tex.

[73] Assignee: SGS-Thomson Microelectronics, Inc., Carrollton, Tex.

[21] Appl. No.: 40,664

[22] Filed: Mar. 31, 1993

[51] Int. Cl.$^6$ .................................................. H01L 29/04
[52] U.S. Cl. .............................. 365/63; 365/51; 257/211; 257/765
[58] Field of Search ................... 365/51, 63, 230.03, 365/203, 154; 257/903, 904, 211, 210, 763, 765, 751, 758

[56] References Cited

U.S. PATENT DOCUMENTS

| | | | |
|---|---|---|---|
| 4,131,951 | 12/1978 | Asahi | 365/203 |
| 4,482,984 | 11/1984 | Oritani | 365/203.03 |
| 4,558,435 | 12/1985 | Hsieh | 365/203 |
| 4,590,588 | 5/1986 | Itoh et al. | 365/51 |
| 4,685,086 | 8/1987 | Tran | 365/203 |
| 4,712,194 | 12/1987 | Yamaguchi et al. | 365/203 |
| 4,920,517 | 4/1990 | Yamauchi et al. | 365/51 |
| 4,926,382 | 5/1990 | Sakui et al. | 365/149 |
| 4,928,268 | 5/1990 | Nogle et al. | 365/203 |
| 4,970,685 | 11/1990 | Koyanagi | 365/51 |
| 4,984,196 | 1/1991 | Tran et al. | 365/51 |
| 5,047,825 | 9/1991 | Yasaka et al. | 257/204 |
| 5,267,192 | 11/1993 | Nogami | 365/154 |
| 5,270,976 | 12/1993 | Tran | 365/230.06 |
| 5,321,280 | 6/1994 | Sakai | 257/211 |
| 5,343,433 | 8/1994 | Duvvury et al. | 257/149 |

FOREIGN PATENT DOCUMENTS

| | | | |
|---|---|---|---|
| 58-221888 | 12/1984 | Japan | 365/203 |

Primary Examiner—David C. Nelms
Assistant Examiner—Vu A. Le
Attorney, Agent, or Firm—Renee M. Larson; Lisa K. Jorgenson; Richard K. Robinson

[57] ABSTRACT

In a high density memory, such as a SRAM, DRAM, EPROM or EEPROM, a hierarchical bitline configuration is utilized such that a number of local bitlines are connected to a master bitline through interface circuitry which connects a local bitline to the master bitline. Local select signals, when set to the appropriate voltage level, couple a local bitline to the master bitline. In addition to reducing the local bitline capacitance that must be driven by memory cells, the hierarchical configuration may provide layout area savings as well.

27 Claims, 1 Drawing Sheet

PASSIVE HIERARCHICAL BITLINE MEMORY ARCHITECTURE WHICH RESIDES IN METAL LAYERS OF A SRAM ARRAY

CROSS REFERENCE TO RELATED APPLICATIONS

The subject matter of the present application is related to copending United States application, titled "Active Hierarchical Bitline Memory Architecture", filed with the Application hereof on Mar. 31, 1993, Ser. No. 08/040,666, attorney assigned to the assignee hereof, and which is herein incorporated by reference.

BACKGROUND OF THE INVENTION

1. Field of the Invention

The present invention relates generally to integrated circuits, and more specifically to a hierarchical bitline memory architecture.

2. Description of the Prior Art

In recent years, high density memories such as SRAMs, DRAMs, EPROMs, and EEPROMs have dramatically increased the level of bitline capacitance which must be driven by memory cells in the memory array. As high speed memories have increased in density, efforts have been made to carefully partition the memory array to reduce the burden on the memory cell for driving large bitline capacitances. For example, memory arrays have gone to four times the number of columns as rows to reduce bitline capacitance. In addition, the rows are sometimes bisected by the sensing and column decode circuitry to further reduce bitline capacitance. In spite of the advances made in careful partitioning of the memory array, bitline capacitance can still be prohibitively large, having an adverse affect on device speed and signal integrity. As a result, better methods for reducing the bitline capacitance as seen by memory cells while using minimum layout area are needed and appropriate.

SUMMARY OF THE INVENTION

In a high density memory, such as a SRAM, DRAM, EPROM or EEPROM, a hierarchical bitline configuration is utilized such that a number of local bitlines are connected to a master bitline through interface circuitry which connects a local bitline to the master bitline. Local select signals, when set to the appropriate voltage level, couple a local bitline to the master bitline. In addition to reducing the local bitline capacitance that must be driven by memory cells, the hierarchical configuration may provide layout area savings as well.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings wherein:

DESCRIPTION OF THE PREFERRED EMBODIMENT

Figure 1:
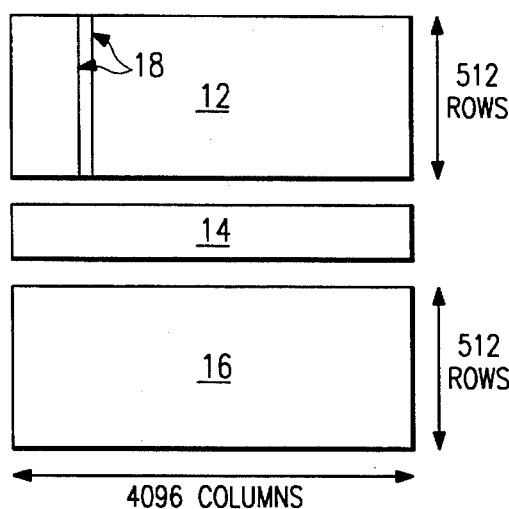
FIG. 1 is a block diagram of a partitioned memory array according to the prior art.

Referring to FIG. 1, a block diagram of a partitioned memory array 10 according to the prior art is shown. As high speed memories, such as SRAMs, have become larger in density, there has been considerable emphasis placed on careful partitioning of the memory array to reduce the capacitance of bitline pairs, such as might be introduced by bitline pair 18, which must be driven by memory cells in the array.

As a result of this emphasis, memory array partitioning has increased in size and complexity. For example, memory arrays have increased the number of columns to four times the number of rows in an effort to reduce bitline capacitance. This is shown in FIG. 1 where there are 4096 columns to 1024 rows, a configuration which is representative of a 4 Megabit SRAM. Also illustrated is the bisection of rows by column decoding and sense amp circuitry 14 into two row sections 12 and 16, each having 512 rows. While this methodology does yield a decrease in bitline capacitance, it may not be sufficient for memories of very high density and/or high speed.

Figure 2:
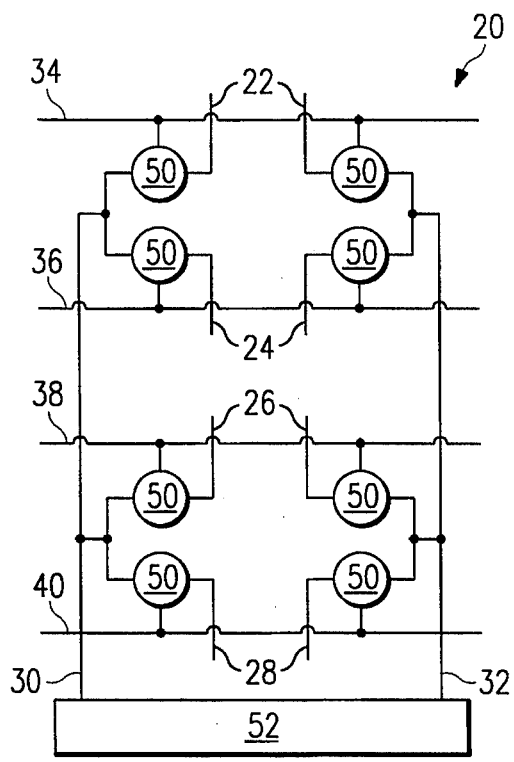
FIG. 2 is a schematic diagram of a portion of a partitioned memory array according to the present invention.

Referring now to FIG. 2, a schematic diagram of a portion of a partitioned memory array 20 according to the present invention is shown. A hierarchical bitline configuration is employed, whereby local bitline pairs, such as 22, 24, 26, and 28 are connected to master bitline 30 and its complement, master bitline 32. Local bitline pairs are composed of two bitlines which are the complement of each other, as is well understood in the art. Likewise, master bitline 30 and master bitline 32 together form a master bitline pair.

Continuing with the 4 Megabit SRAM example, the 512 cell bitline of FIG. 1 is divided into four local bitline pairs 22, 24, 26, and 28 of 128 cells each. Each local bitline pair is separated from the other three local bitline pairs by interface circuitry 50 which is passive circuitry that connects a local bitline to master bitline 30 and master bitline 32. Local select signals 34, 36, 38, and 40 each couple an associated local bitline to master bitline 30 and master bitline 32. For example, local select signal 34 couples its local bitline 22 to master bitline 30 and 32.

As discussed above, a long bitline pair has been divided into four local bitline pairs; however, it is valid to break the bitline into any number of local bitline pair segments. The tradeoff to be considered is that while a larger number of segments would yield less capacitance and thus faster signal development, this would be done at the expense of additional layout area being consumed by an increased number of interface circuitry 50 and increased loading on the master bitline. However, if traditional architecture having an equal number of rows as columns is used and column decoding and sense amp circuitry 14 as shown in FIG. 1 is placed at the edge of the memory array, then utilization of hierarchical architecture having master and local bitlines can result in layout area savings. This technique will utilize a smaller die than the prior art memory array of FIG. 1 and will result in equal or better performance as measured by decreased bitline capacitance. The use of master bitlines allows for a smaller memory die even if the performance is the same.

For high density memories, three metal layers may be utilized to achieve layout savings and to render local and master bitlines and wordline control. For example, it may be desirable to place master wordlines and sub-master wordlines in the first metal layer M1, local bitlines in M2, and master bitlines in M3. Master bitlines can be placed on top of local bitlines or at an offset from local bitlines such that layout area is conserved and local bitline capacitance is reduced. A master bitline in M3 could be placed directly on top of its associated local bitline which resides in M2. The master bitline capacitance is primarily bussing capacitance of the highest level conductor, in this case M3, with virtually no junction capacitance except at interface circuitry 50. Therefore, if the master bitline 30 and master bitline 32 are placed over the local bitline, up to one-third of the bus would couple to itself; it is not necessary for the master bitline pair to be placed over the first local bitline pair 22 if sensing circuitry and master bitline control 52 is situated at the bottom as shown in FIG. 2. The bitline capacitance that a memory cell must drive is reduced by as much as one-fourth the typical capacitance of the prior-art.

Due to the relative newness of a third metal layer, pitch control may not be as readily available for the third metal layer as for the first and second metal layers. Since master and sub-master wordlines typically do not require as much pitch control as master and local bitlines, an alternate utilization of metal layers is to place local bitlines in M1, master bitlines in M2 and master and sub-master wordlines in M3. This arrangement of metal layers may make the manufacturing process easier to control.

Local bitlines which are not selected by their respective local select signals should not be allowed to float at an undetermined voltage level for an indefinite period of time. A bitline pull up transistor may be placed on each local bitline, but this solution requires a good amount of layout area, area which would be desirable to conserve as much as possible. As an alternative, a high value resistor may be formed in polysilicon 1, 2, or 3 layers, or in the active diffusion region to serve as a maintaining current source at the chosen voltage level, typically $V_{CC}$ or $V_{CC}-V_T$. High value resistors in the local bitlines may greatly reduce the layout area required for high density devices and prevent local bitlines from floating at undetermined voltage levels. Similarly, the master bitline may also have its own load device for facilitating read and write operations, whereby writing is performed using conventional methods and sensing may be accomplished using conventional voltage or current sensing techniques.

Figure 3A:
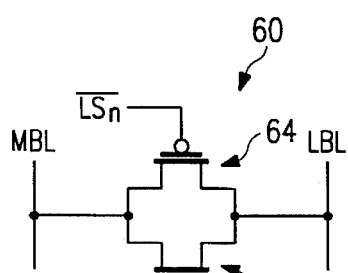
FIG. 3a is a schematic diagram of a full CMOS transmission gate utilized as interface circuitry according to a first preferred embodiment of the present invention.
Figure 3B:
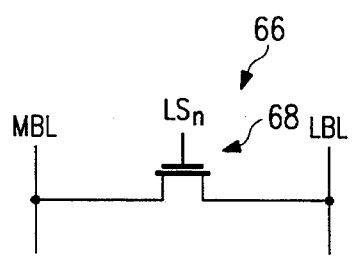
FIG. 3b is a schematic diagram of an n-channel transistor utilized as interface circuitry according to a second preferred embodiment of the present invention.

Interface circuitry 50 may be implemented a variety of ways but it must allow the reading and writing of memory cells. Referring to FIG. 3a and 3b, a schematic diagram of a full CMOS transmission gate and an n-channel transistor, respectively, are illustrated as interface circuitry according to a first and a second preferred embodiment of the present invention. The full CMOS transmission gate of FIG. 3a has an n-channel transistor 62 and a p-channel transistor 64 which together connect the master bitline (MBL) to the local bitline (LBL). The gate of n-channel transistor 62 is connected to local select signal $LS_n$ while the gate of p-channel transistor 64 is connected to the complement of the local select signal, $LS_n$. An advantage of CMOS transmission gate 60 is the ease of reading and writing of memory cells it provides, especially when the LBL is biased at the supply voltage, usually $V_{CC}$. On the other hand, since CMOS transmission gate 60 is composed of two transistors, more layout area is required than if only a single transistor were used.

FIG. 3b shows a second preferred embodiment of interface circuitry 66, using only a single n-channel transistor 68. An obvious advantage of n-channel transistor 68 is that only one transistor, not two, is used and thus less layout area is required. However, bootstrapping of the local select signal, $LS_n$, above $V_{CC}$ be required, especially if local bitlines are biased at $V_{cc}$, in order to avoid a $V_T$ drop across n-channel transistor 68. It may be possible to obviate the need for bootstrapping if n-channel transistor 68 has a natural $V_T$ (without implant) of 0.3 volts rather than a normal $V_T$ of approximately 0.65 volts and an n-channel pull up is used on the local bitline. Additionally, utilizing a pumped well in order to reduce body effect may also make bootstrapping unnecessary. It is possible to pump the well in which n-channel transistor 68 resides to a lower voltage than $V_{SS}$. It will be understood by one skilled in the art that, while a pumped well and a natural $V_T$ are not necessary, they are enhancements that may or may not be made.

Figure 4:
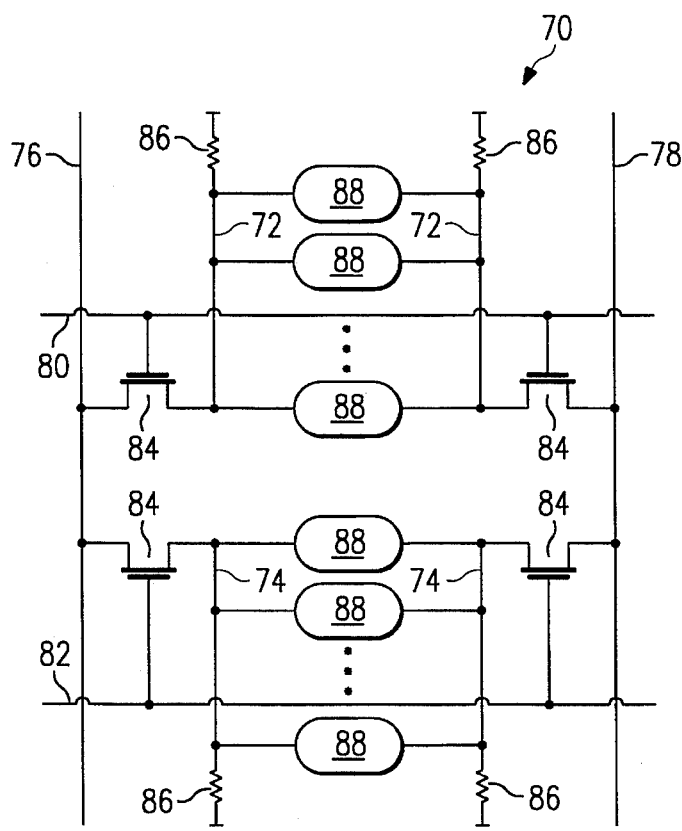
FIG. 4 is a schematic diagram of a partitioned memory array having interface circuitry and local bitline resistors, according to the present invention.

Referring now to FIG. 4, shown is a schematic diagram of a partitioned memory array 70 which uses n-channel transistor interface circuitry and local bitline high value resistors such that local bitlines do not float. For simplicity, only two of the four local bitlines required for the 4 Megabit example are shown: local bitline pairs 72 and 74. Local bitline pairs 72 and 74 have high value resistors 86 which tie the local bitline pair to $V_{CC}$ such that it does not float. A typical value for high value resistor 86 is 1 Megohm. The local bitline pairs are connected to master bitline 76 and master bitline 78 by n-channel transistors 84, the interface circuitry described in FIG. 3b. Local select signals 80 and 82 couple local bitlines 72 and 74, respectively, to master bitline 76 and master bitline 78. The use of n-channel transistor interface circuitry 84 and resistive load 86 greatly decreases the level of bitline capacitance which must be driven by memory cells 88 and ties the local bitlines to a predetermined voltage.

The recovery of local bitlines through precharge and/or equilibrate can be accomplished by leaving local select signals on while the master bitline pair is being recovered. If required, local bitline pairs could have their own equilibrate and/or precharge devices, such as a p-channel or other shorting transistor, where equilibrate is decoded based on local select signals. In addition, on a synchronous or pipelined device, multiple wordlines associated with different local bitlines could be selected at the same time, if advantageous. This would allow independent development of signals on each local bitline, where the clocking of local select signals are performed at the appropriate time. This would, of course, increase the power consumption level. However, if signal swing on the local bitlines is reduced, equilibrate and/or precharge may be avoided entirely, except at the end of a write cycle. Thus, circuitry needed for equilibrate and/or precharge functions would be reduced or eliminated.

The hierarchical bitline memory architecture described above is useful for asynchronous, asynchronous and pipelined memory devices such as SRAMs, DRAMs, EPROMs and EEPROMs. It is particularly useful on high density, high performance devices such as the 4 Megabit SRAM, 16 Megabit SRAM and larger devices, to reduce the effective bitline capacitance a memory cell must drive. The speed advantage which could be realized with the hierarchical memory architecture would depend on the density of the device and the number of partitions of the bitline into local bitlines (at the expense of area) but could be on the order of several nanoseconds.

While the invention has been particularly shown and described with reference to a preferred embodiment, it will be understood by those skilled in the art that various changes in form and detail may be made therein without departing from the spirit and scope of the invention. For instance, local bitline pairs have been described in conjunction with the 4 Megabit SRAM embodiment, but one skilled in the art will appreciate that while other high density memories such as DRAMs, EPROMs, and EEPROMs have bitlines, not bitline pairs, the spirit and scope of the invention will not be affected. Additionally, the placement of the master bitlines in the third metal layer and local bitlines in the second metal layer is only one possible way to implement device metallization. Also, master and sub-master wordlines, master bitlines, and local bitlines could be placed in any conductive material such as metal or polysilicon.

What is claimed is:

1. A partitioned static random access memory (SRAM) array, comprising:
   a plurality of master bitlines which reside in a first metal layer of the partitioned SRAM array;
   a plurality of local bitlines, which reside in a second metal layer of the partitioned SRAM array, connected to a plurality of memory cells, wherein each local bitline is connected to a loading element such that each bitline is tied to a predetermined voltage level;
   a plurality of interface circuits, which connects master bitline to at least two of the local bitlines; and
   a plurality of local select signals, each capable of selecting a corresponding local bitline to be coupled to its corresponding master bitline.

2. The memory array of claim 1, wherein each local select signal controls one interface circuit for each master bitline.

3. The memory array of claim 1, wherein the interface circuitry is comprised of a n-channel transistor.

4. The memory array of claim 3, wherein the gate of the n-channel transistor is connected to a local select signal.

5. The memory array of claim 3, wherein the local select signals are bootstrapped above a first supply voltage.

6. The memory array of claim 5, wherein the first supply voltage is $V_{cc}$.

7. The memory array of claim 3, wherein the n-channel transistor has a lower $V_T$ such that the voltage drop across it is minimized.

8. The memory array of claim 3, wherein a well in which the n-channel transistor resides is pumped to a lower voltage which is less than a second supply voltage.

9. The memory array of claim 8, wherein the second supply voltage is $V_{ss}$.

10. The memory array of claim 1, wherein the interface circuitry is comprised of a full CMOS transmission gate having a n-channel transistor and a p-channel transistor.

11. The memory array of claim 10, wherein the gate of the n-channel transistor is connected to a local select signal and the gate of the p-channel transistor is connected to the complement of the local select signal.

12. The memory array of claim 1, wherein the loading element is a high value resistor.

13. The memory array of claim 12, wherein the high value resistor is formed in a polysilicon layer.

14. The memory array of claim 13, wherein the high value resistor is formed in an active diffusion region.

15. The memory array of claim 1, wherein the loading element is a pull up transistor.

16. The memory array of claim 1, wherein the memory array is formed using a first metal layer, a second metal layer, and a third metal layer.

17. The memory array of claim 16, wherein the master bitlines are formed on top of the local bitlines.

18. The memory array of claim 16, where the master bitlines are formed at an offset from the local bitlines.

19. The memory array of claim 1, wherein the first metal layer which contains the master bitlines is above the second metal layer which contains the local bitlines.

20. The memory array of claim 12, wherein each local bitline is a local bitline pair and each master bitline is a master bitline pair.

21. The memory array of claim 20, wherein the partitioned SRAM array is a 4 Megabit SRAM which is comprised of four local bitline pairs connected to a master bitline pair, each bitline pair having 128 memory cells.

22. The 4 Megabit SRAM of claim 21, wherein the interface circuitry is an n-channel transistor.

23. The memory array of claim 1, wherein one of the local bitlines may be recovered when its local select signal is selected while its corresponding master bitline is being recovered.

24. The memory array of claim 1, wherein each local bitline has an equilibrate device which is controlled by an equilibration signal.

25. The memory array of claim 24, wherein the equilibration signal is decoded based on its corresponding local select signal.

26. The memory array of claim 1, wherein each local bitline has a precharge device which is controlled by a precharge signal.

27. The memory array of claim 26, wherein the precharge signal is decoded based on its corresponding local select signal.

* * * * *